(12) United States Patent
Hsu et al.

(10) Patent No.: US 11,587,630 B2
(45) Date of Patent: Feb. 21, 2023

(54) PROGRAM WITH CONSECUTIVE VERIFIES FOR NON-VOLATILE MEMORY

(71) Applicant: SANDISK TECHNOLOGIES LLC, Addison, TX (US)

(72) Inventors: Cynthia Hsu, Fremont, CA (US); Fanglin Zhang, Fremont, CA (US)

(73) Assignee: SANDISK TECHNOLOGIES LLC, Addison, TX (US)

(*) Notice: Subject to any disclaimer, the term of this patent is extended or adjusted under 35 U.S.C. 154(b) by 0 days.

(21) Appl. No.: 17/206,865

(22) Filed: Mar. 19, 2021

(65) Prior Publication Data

US 2022/0301644 A1 Sep. 22, 2022

(51) Int. Cl.
  *G11C 16/04* (2006.01)
  *G11C 16/34* (2006.01)
  *G11C 16/10* (2006.01)

(52) U.S. Cl.
  CPC ......... *G11C 16/3459* (2013.01); *G11C 16/10* (2013.01); *G11C 16/0483* (2013.01)

(58) Field of Classification Search
  CPC .. G11C 16/3459; G11C 16/10; G11C 16/0483
  USPC .................................................. 365/185.22
  See application file for complete search history.

(56) References Cited

U.S. PATENT DOCUMENTS

2016/0172041 A1* 6/2016 Sakui .................. G11C 11/5628
                                                365/185.12
2017/0278580 A1* 9/2017 Lim .................... G11C 16/0483

* cited by examiner

*Primary Examiner* — Tha-O H Bui
(74) *Attorney, Agent, or Firm* — Morgan, Lewis & Bockius LLP (57) ABSTRACT

A data storage system includes a storage medium including a plurality of strings of single-level cell (SLC) memory cells connected to a plurality of word lines; and a storage controller in communication with the storage medium, the storage controller including write circuitry configured to write data to the storage medium by: selecting a first word line of the plurality of word lines, the first word line being connected to a first plurality of strings; consecutively programming a first group of memory cells of the first plurality of strings connected to the first word line; and subsequent to programming the first group of memory cells, consecutively verifying respective programming results of the first group of memory cells.

18 Claims, 5 Drawing Sheets

PROGRAM WITH CONSECUTIVE VERIFIES FOR NON-VOLATILE MEMORY

TECHNICAL FIELD

The present disclosure relates to data storage systems, and, in particular, to programming techniques involving consecutive verification operations.

BACKGROUND

Non-volatile memories, such as flash memory devices, have supported the increased portability of consumer electronics, and have been utilized in relatively low power enterprise storage systems suitable for cloud computing and mass storage. The ever-present demand for almost continual advancement in these areas is often accompanied by demand to improve data storage capacity. The demand for greater storage capacity, in turn, stokes demand for greater performance (e.g., quicker reads and writes), so that the addition of storage capacity does not slow down the memory device. As such, there is ongoing pressure to increase the capacity and the operating speed of non-volatile memories in order to further improve the useful attributes of such devices.

SUMMARY

This application describes various systems and methods for improving write performance by reducing the amount of time required to program and verify data to a storage medium. Various implementations of systems and methods within the scope of the appended claims each have several aspects, no single one of which is solely responsible for the desirable attributes described herein. Without limiting the scope of the appended claims, some prominent features are described. After considering this discussion, and particularly after reading the section entitled "Detailed Description," one will understand how the features of various implementations are used to improve write performance.

BRIEF DESCRIPTION OF THE DRAWINGS

So that the present disclosure can be understood in greater detail, a more particular description may be had by reference to the features of various implementations, some of which are illustrated in the appended drawings. The appended drawings, however, merely illustrate the more pertinent features of the present disclosure and are therefore not to be considered limiting, for the description may admit to other effective features.

In accordance with common practice, the various features illustrated in the drawings may not be drawn to scale. Accordingly, the dimensions of the various features may be arbitrarily expanded or reduced for clarity. In addition, some of the drawings may not depict all of the components of a given system, method or device. Finally, like reference numerals are used to denote like features throughout the specification and figures.

DETAILED DESCRIPTION

Figure 1:
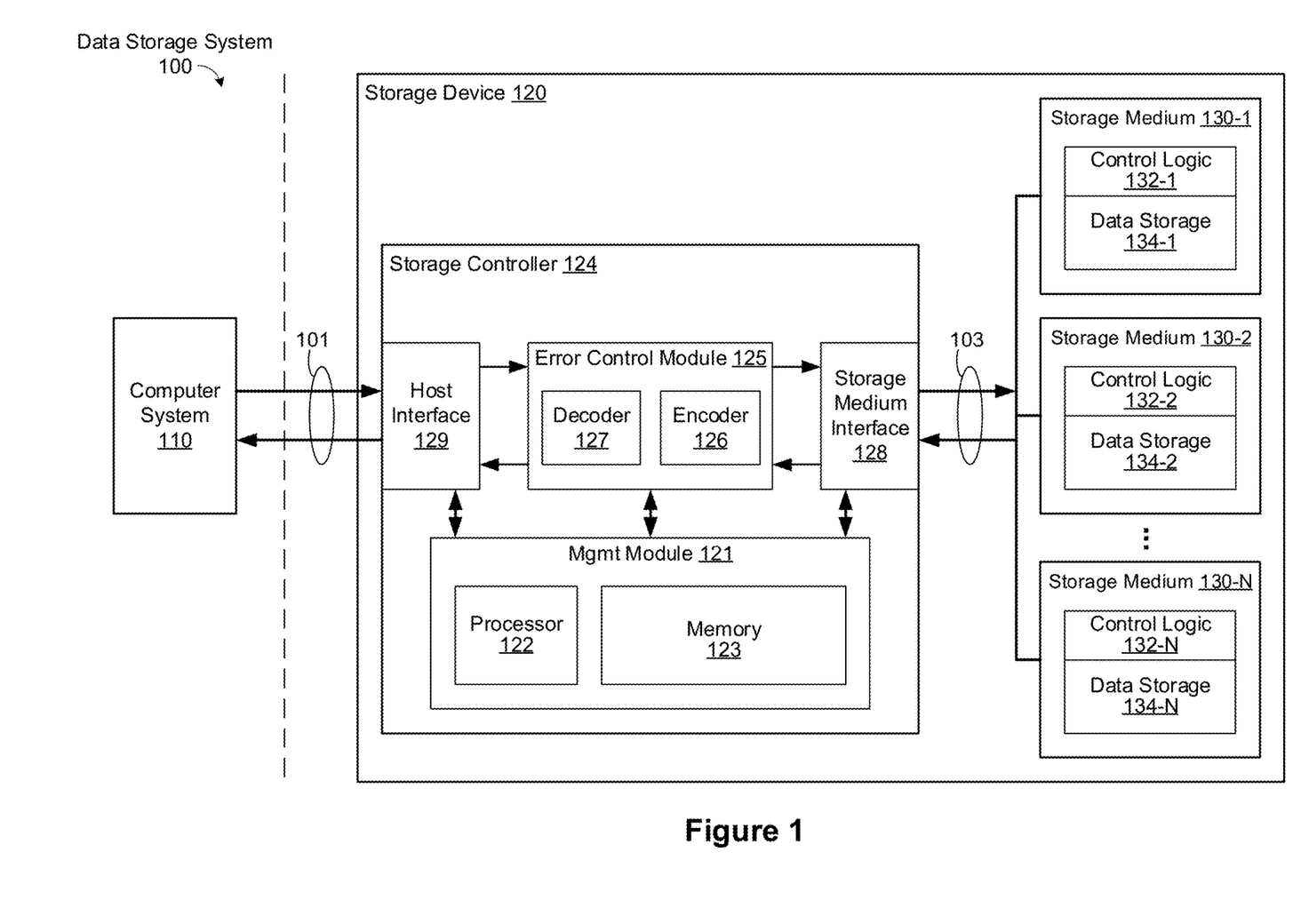
FIG. 1 is a block diagram of a data storage system in accordance with some implementations.

FIG. 1 is a diagram of an implementation of a data storage environment, namely data storage system 100. While certain specific features are illustrated, those skilled in the art will appreciate from the present disclosure that various other features have not been illustrated for the sake of brevity, and so as not to obscure more pertinent aspects of the example implementations disclosed herein. To that end, as a non-limiting example, the data storage system 100 includes a data processing system (alternatively referred to herein as a computer system or host) 110, and a storage device 120.

The computer system 110 is coupled to the storage device 120 through data connections 101. In various implementations, the computer system 110 includes the storage device 120 as a component. Generally, the computer system 110 includes any suitable computer device, such as a computer, a laptop computer, a tablet device, a netbook, an internet kiosk, a personal digital assistant, a mobile phone, a smartphone, a gaming device, a computer server, a peripheral component interconnect (PCI), a serial AT attachment (SATA), or any other computing device. In some implementations, the computer system 110 includes one or more processors, one or more types of memory, a display, and/or other user interface components such as a keyboard, a touch screen display, a mouse, a trackpad, a digital camera, and/or any number of supplemental devices to add functionality.

The storage device 120 includes one or more storage mediums 130 (e.g., N storage mediums 130, where N is an integer greater than or equal to 1). The storage medium(s) 130 are coupled to a storage controller 124 through data connections of a channel 103. In various implementations, the storage controller 124 and storage medium(s) 130 are included in the same device (e.g., storage device 120) as constituent components thereof, while in other embodiments, the storage controller 124 and storage medium(s) 130 are, or are in, separate devices. In some embodiments, the storage controller 124 is an application-specific integrated circuit (ASIC). The storage medium(s) 130 are optionally referred to as the NAND.

Each storage medium 130 includes control logic 132 and data storage 134. The data storage 134 may comprise any number (i.e., one or more) of memory devices including, without limitation, non-volatile semiconductor memory devices, such as flash memory. Flash memory devices can be configured for enterprise storage suitable for applications such as cloud computing, and/or configured for relatively smaller-scale applications such as personal flash drives or hard-disk replacements for personal, laptop and tablet computers.

In some implementations, the storage controller 124 includes a management module 121, an error control module 125, a storage medium interface 128, and a host interface 129. In some implementations, the storage controller 124 includes various additional features that have not been illustrated for the sake of brevity, so as not to obscure more pertinent features of the example implementations disclosed herein. As such, a different arrangement of features may be possible.

The host interface 129 couples the storage device 120 and its storage controller 124 to one or more computer systems 110. The host interface 129 typically includes data buffers (not shown) to buffer data being received and transmitted by the storage device 120 via the data connections 101.

The storage medium interface 128 couples the storage controller 124 to the storage medium(s) 130. The storage medium interface 128 provides an interface to the storage medium(s) 130 though the data connections of the channel 103. In some implementations, the storage medium interface 128 includes read and write circuitry.

The error control module 125 is coupled between the storage medium interface 128 and the host interface 129. In some implementations, the error control module 125 is provided to limit the number of uncorrectable errors inadvertently introduced into data. To that end, the error control module 125 includes an encoder 126 and a decoder 127. The encoder 126 encodes data to produce a code word, which is subsequently stored in a storage medium 130. When the encoded data is read from the storage medium 130, the decoder 127 applies a decoding process to recover the data and correct errors within the error correcting capability of the error control code. Various error control codes have different error detection and correction capacities, and particular codes are selected for various applications.

The management module 121 typically includes one or more processors 122 (sometimes referred to herein as CPUs, processing units, hardware processors, processors, microprocessors or microcontrollers) for executing modules, programs and/or instructions stored in memory and thereby performing processing operations. However, in some implementations, the processor(s) 122 are shared by one or more components within, and in some cases, beyond the function of the storage controller 124. The management module 121 is coupled by communication buses to the host interface 129, the error control module 125, and the storage medium interface 128 in order to coordinate the operation of these components.

The management module 121 also includes memory 123 (sometimes referred to herein as controller memory), and one or more communication buses for interconnecting the memory 123 with the processor(s) 122. Communication buses optionally include circuitry (sometimes called a chipset) that interconnects and controls communications between system components. The controller memory 123 includes high-speed random access memory, such as DRAM, SRAM, DDR RAM or other random access solid state memory devices, and may include non-volatile memory, such as one or more magnetic disk storage devices, optical disk storage devices, flash memory devices, or other non-volatile solid state storage devices. The controller memory 123 optionally includes one or more storage devices remotely located from the one or more processors 122. In some embodiments, the controller memory 123, or alternatively the non-volatile memory device(s) within the controller memory 123, comprises a non-transitory computer readable storage medium. In some embodiments, the controller memory 123, or the non-transitory computer readable storage medium of the controller memory 123, stores the programs, modules, and/or data structures, or a subset or superset thereof, for performing one or more of the operations described in this application with regard to any of the components associated with the storage controller 124.

In some embodiments, the various operations described in this application correspond to sets of instructions for performing the corresponding functions. These sets of instructions (i.e., modules or programs) need not be implemented as separate software programs, procedures or modules, and thus various subsets of these modules may be combined or otherwise rearranged in various embodiments. In some embodiments, the memory 123 may store a subset of modules and data structures. Furthermore, the memory 123 may store additional modules and data structures. In some embodiments, the programs, modules, and data structures stored in the memory 123, or the non-transitory computer readable storage medium of the memory 123, provide instructions for implementing any of the methods described below. Stated another way, the programs or modules stored in the memory 123, when executed by the one or more processors 122, cause the storage device 120 to perform any of the operations described below. Although FIG. 1 shows various modules, FIG. 1 is intended more as a functional description of the various features, which may be present in the modules than as a structural schematic of the embodiments described herein. In practice, the programs, modules, and data structures shown separately could be combined, and some programs, modules, and data structures could be separated.

Data to be written is conveyed across channel 103 via the storage medium interface 128 when the storage controller 124 writes (programs) data to the storage medium 130. The programming scheme for a memory device may include two types of write operations—"program" and "verify." Program operations include the application of one or more programming pulses across a plurality of cells (e.g., at the block or sub-block level, for consecutive pages), also referred to as write operations. To program memory cells having a single-level cell (SLC) scheme, only one pulse may be required. Verify operations include the application of a sense voltage to a plurality of cells recently subject to a program operation, in order to determine the state of each cell and verify that the sensed state matches the expected state, thereby verifying the program operation. As a result of a verify operation, a pass/fail status may be acquired by the storage controller 124 regarding a corresponding program operation, and if any cells (or more than a threshold of cells) failed, a follow-up program operation may be performed, optionally followed by another verify operation. The program/verify cycle may repeat until all cells pass, or until a threshold of time is reached. Write performance depends on the efficiency of the aforementioned program and verify operations. Various techniques for optimizing write performance are described herein.

Figure 2:
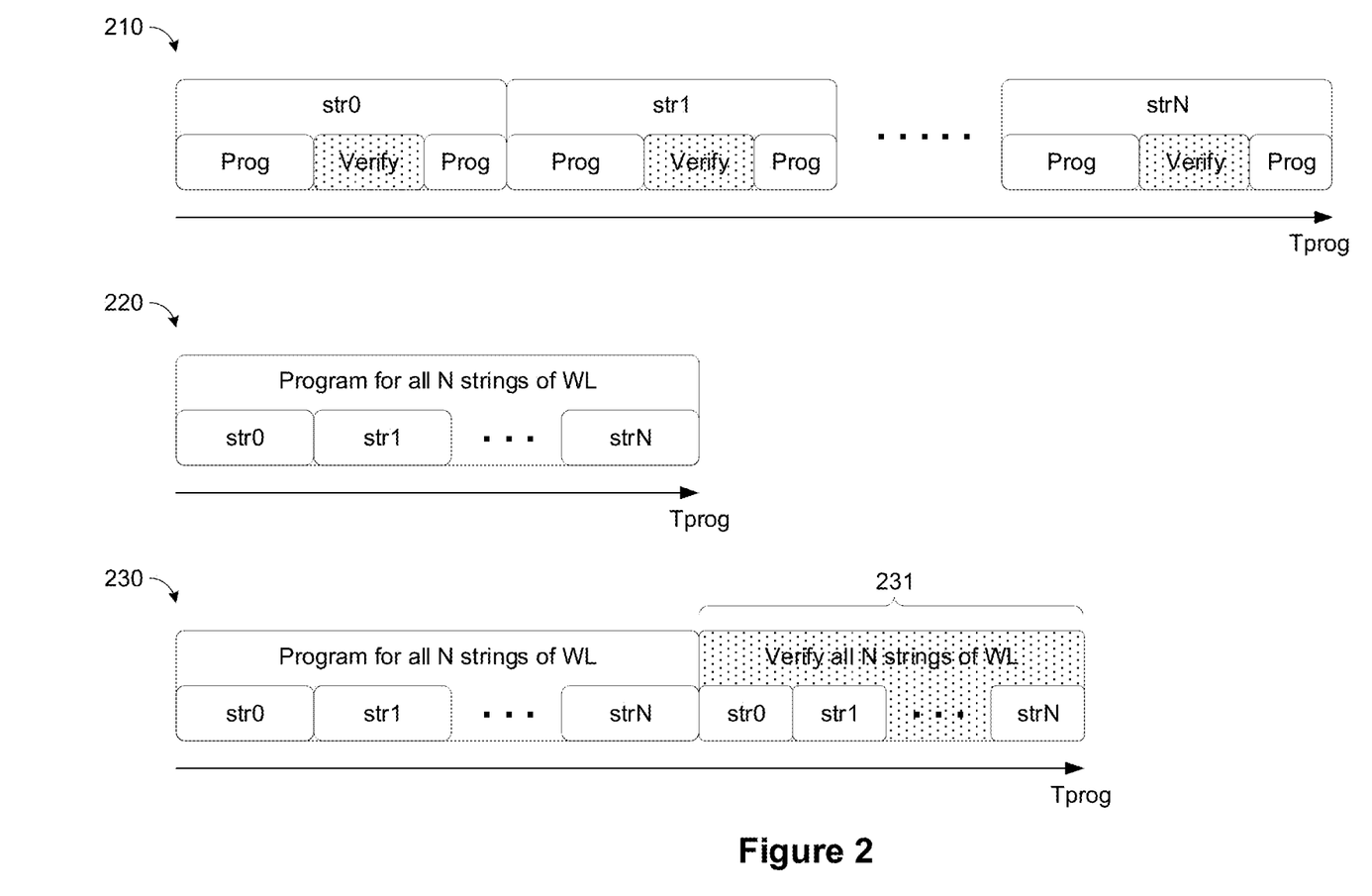
FIG. 2 depicts programming schemes for verifying program pulses in accordance with some implementations.

FIG. 2 depicts three programming schemes 210, 220, and 230 for verifying program pulses in accordance with some implementations. In each scheme, a word line (WL) includes N strings (or pages) of memory cells (str0 through strN), where N is at least 2.

In scheme 210, the cells are programmed and verified on a string-by-string basis. A memory cell in str0 for a selected word line is programmed (Prog), and a verify operation (Verify) follows. In the event of a failure (the verify operation determines that the memory cell was not sufficiently programmed), an additional program operation may follow the verify operation for that string. Next, a memory cell in str1 for the selected word line is programmed and verified, then a memory cell in str2 for the selected word line is programmed and verified, and so forth. The word line voltage ramps down and up between program operations. The total amount of time it takes to program and verify the cells in every string of the selected word line is Tprog. Using example timing values for non-limiting illustration purposes, a single program pulse may require 45 μs, and a single verify may require 37 μs. If the word line has 5 strings, then for scheme 210, Tprog=(45+37)*5=410 μs.

In scheme 220, the cells are programmed consecutively (on a string-by-string basis), but not verified. For an SLC scheme, skipping the verify operation may be an option based on other factors, such as efficiency, endurance, and accuracy requirements. Using the example timing values above, for scheme 220, Tprog=45*5=225 µs. While this is a significant improvement over Tprog for scheme 210, scheme 220 does not provide pass/fail status (no indication regarding whether the program operation was successful) since there the verify operations are skipped. Depending on accuracy requirements, this may not be an adequate approach to optimizing write performance.

In scheme 230, the cells are programmed consecutively (on a string-by-string basis), and then the cells are verified consecutively (on a string-by-string basis via consecutive verify operations 231) following the programming operations.

More specifically, the storage controller 124 writes data to the storage medium 130 by selecting a first word line of a plurality of word lines of the storage medium 130, the first word line being connected to a first plurality of strings (str0-strN). The storage controller 124 consecutively programs a first group of memory cells of the first plurality of strings connected to the first word line, wherein the first group of memory cells includes a first memory cell from a first string of the plurality of strings (e.g., an SLC memory cell connected to the first word line and str0), a second memory cell from a second string of the plurality of strings (e.g., an SLC memory cell connected to the first word line and str1), and so forth, up to an Nth memory cell from the Nth string of the plurality of strings (e.g., an SLC memory cell connected to the first word line and strN). Subsequent to programming the first group of memory cells (after each cell connected to the first word line and strings str0-strN), the storage controller 124 consecutively verifies respective programming results of the first group of memory cells. In more detail, the storage controller 124 consecutively verifies the program result (pass/fail) of the first memory cell from the first string of the plurality of strings (e.g., the SLC memory cell connected to the first word line and str0), the program result (pass/fail) of the second memory cell from the second string of the plurality of strings (e.g., the SLC memory cell connected to the first word line and str1), and so forth, up to the program result (pass/fail) of the Nth memory cell from the Nth string of the plurality of strings (e.g., the SLC memory cell connected to the first word line and strN).

Using the example timing values discussed above, the first verify operation (for str0) may require 37 µs. However, subsequent verify operations may only require 8 µs (since each page/string shares the same word line, no word line voltage ramp up/down is required between each verify operation, resulting in more efficient verify operations). As such, for scheme 230, Tprog=[45*5]+[37+8*4]=294 µs. This scheme is 28% more efficient than scheme 210, while still providing pass/fail status for the programmed cells. As such, scheme 230 provides improved SLC program performance without having to sacrifice verify operations and the program status indications that they provide. Stated another way, scheme 230 provides SLC program status with minimum impact to Tprog by grouping verify operations for all strings sharing the same word line.

Figure 3:
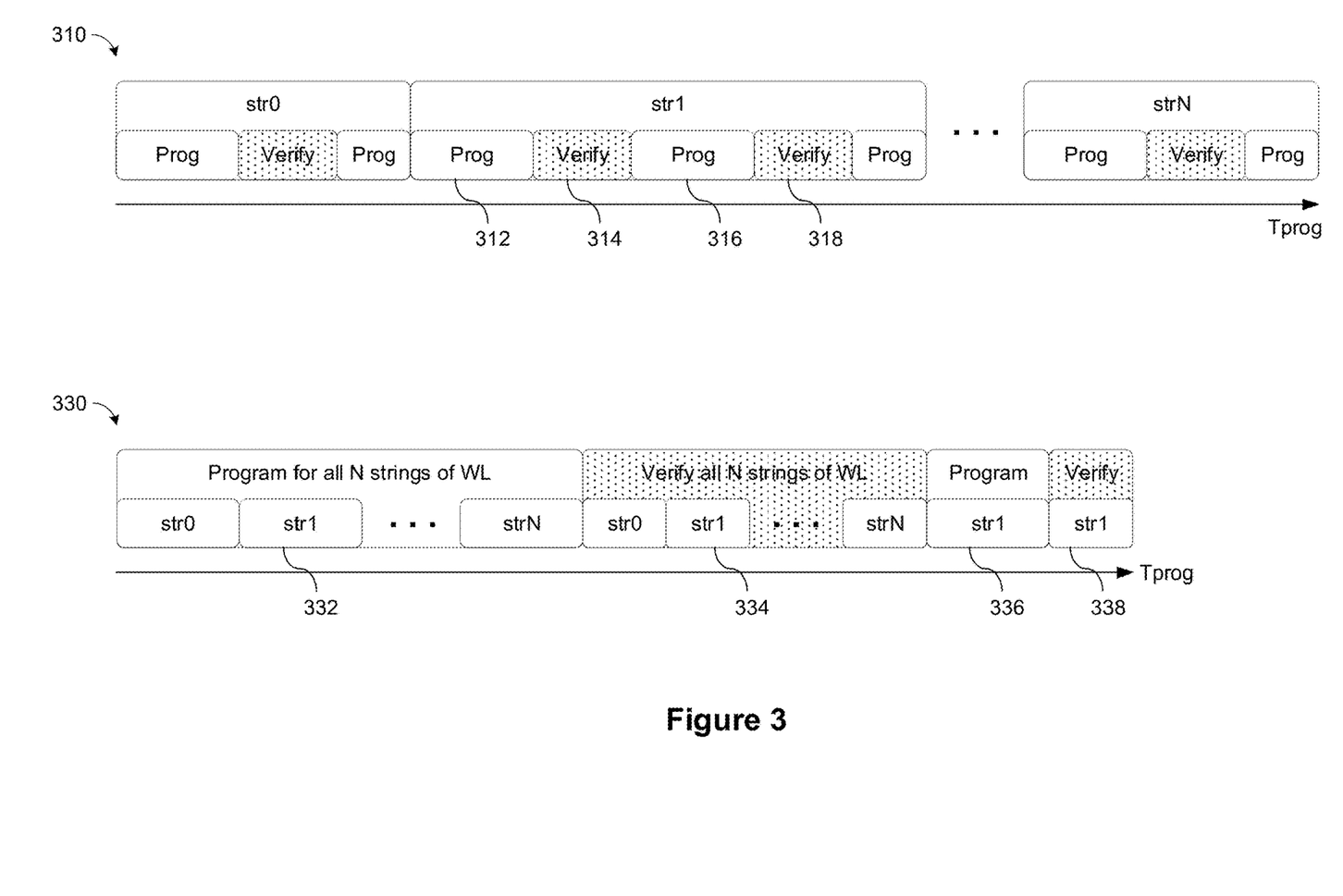
FIG. 3 depicts programming schemes for verifying more than one program pulse for a particular string in accordance with some implementations.

For schemes 210 or 230, if the verify operation for a particular string indicates a failed program operation, another program pulse (and verify operation) may follow for that particular string. FIG. 3 depicts programming schemes 310 and 330 (corresponding to schemes 210 and 230) for verifying more than one program pulse for a particular string in accordance with some implementations.

In scheme 310, verify operation 314 indicates a failed program operation 312 for the initial program pulse in str1. As a result, a second program/verify loop including program operation 316 (a second program pulse for str1) and verify operation 318 are executed for str1. The programming of subsequent strings does not commence until str1 is complete and either all cells pass or a threshold of time has been reached.

In scheme 330, verify operation 334 indicates a failed program operation 332 for the initial program pulse in str1. As a result, a second program/verify loop including program operation 336 (a second program pulse for str1) and verify operation 338 are executed for str1 following all of the verify operations for each of the N strings. The programming of subsequent strings is not affected by the fail status indicated by the verification operation 334, thereby allowing for optimized write performance without having to sacrifice remedial efforts to correct errors (e.g., subsequent program/verify operations 336/338).

Figure 4:
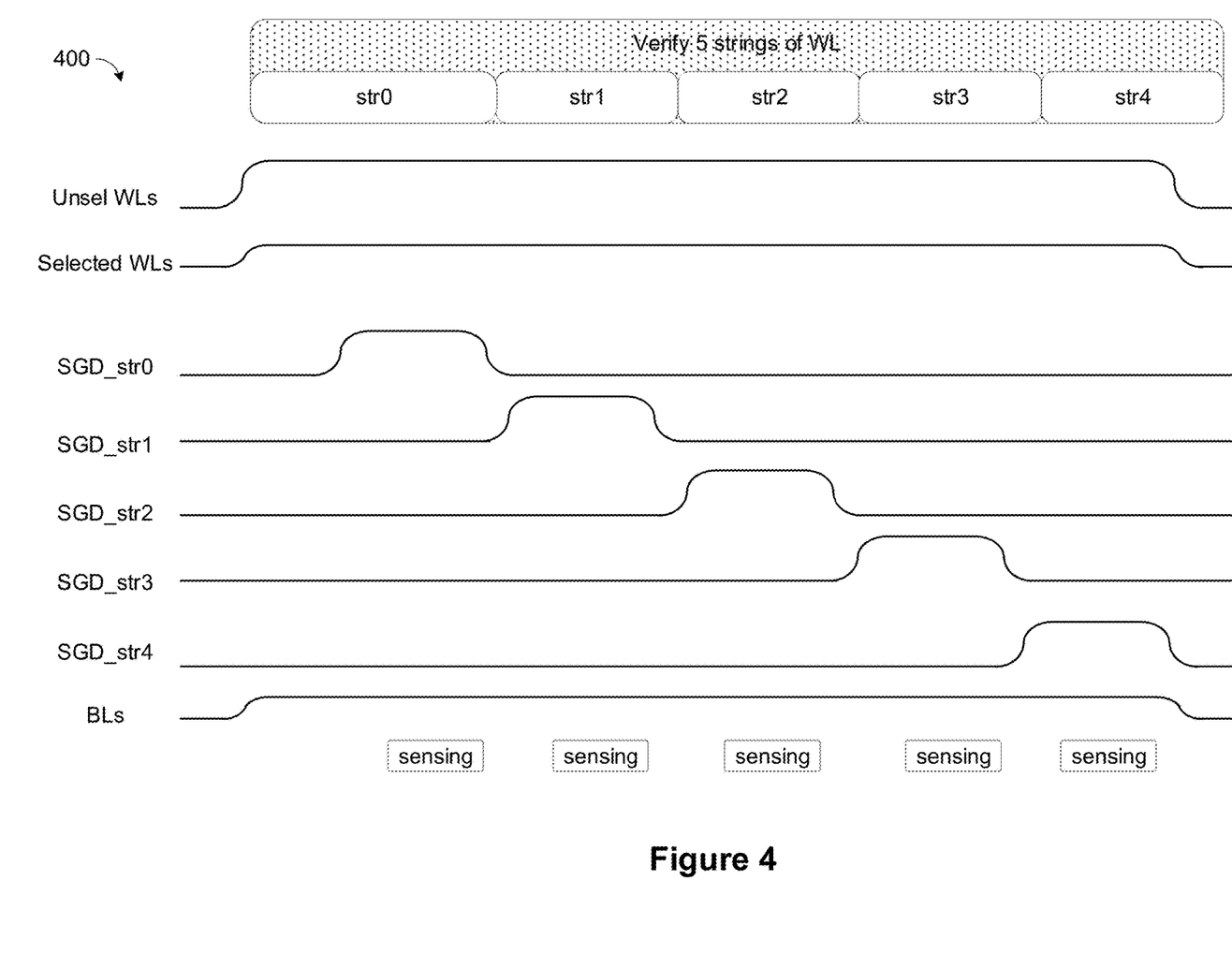
FIG. 4 is a timing diagram for consecutive verification operations in accordance with some implementations.

FIG. 4 is a timing diagram 400 for consecutive verification operations (e.g., verify operations 231, FIG. 2) in accordance with some implementations. A plurality of strings of a particular word line are consecutively verified as a group, as described above. By combining the verify operations for a plurality of strings of a selected word line in this manner, the voltage level of the selected word line does not need to discharge between each verification operation. This saves rise/recovery time (also referred to as ramp up and discharge time), which optimizes the performance of write (program/verify) operations employing this scheme. Only the drain-side select gate (SGD) of the selected string for a respective verification operation turns on during each respective verification operation.

More specifically, throughout the group verification process for each string of a selected word line, the selected word line is asserted to a verification voltage level (higher than 0V but lower than a read voltage level). The unselected word lines are biased high (to a read voltage level) to ensure they are conducting. The voltage levels of each word line (selected and unselected) remain asserted at their respective levels until each of the verification operations is complete (e.g., after str4 is verified), at which point the word lines may be de-asserted.

As each string of the selected word line is consecutively verified (a first cell on a first string, followed by a second cell on a second string, followed by a third cell on a third string, and so forth, with each cell being connected to the selected word line), the SGD for each respective string is consecutively asserted. A cell in a particular string is subjected to the verification operation (sensing) while an SGD for the particular string is asserted.

The bit lines (BLs) for the cells of each string are also asserted during the group verification process, and they remain asserted until the group verification is completed. This is due to no-lockout sensing being adopted. Since different strings are being sensed, and subsequent strings can behave independently of previously sensed strings, the conducting cells do not need to be locked out throughout the group verification process. This saves bit line rise/recovery time, which further optimizes the performance of write (program/verify) operations employing this scheme.

In some implementations, each of the N strings of a selected word line is associated with a data latch. For example, for N=5, there are five data latches DL1-DL5, enough to save 5 pages of program data. After the first verification operation (on str0), only N−1 (e.g., 4) latches are needed. After the sensing/detection phases of the verification operation for a given string (e.g., str0), the data latch for that string (e.g., DL1) may be released for the storage controller 124 to enter data for the next word line (even while the current word line is still being verified). This further optimizes the performance of write (program/verify) operations employing this scheme. There is no performance impact for cache programming.

More specifically, following the above example with five pages of data and a plurality of word lines (including a first word line and a second word line), the storage controller 124 enters data for all five strings (str0-str4) of the first word line into data latches DL1-DL5 for programming. The data for all five strings is programmed as described above with reference to scheme 230 (FIG. 2). Following the programming, the str0 data in latch DL1 is verified, and DL1 is released for latching data to be programmed into str0 of the second word line. While this is happening, the str1 data in latch DL2 (for the first word line) is being verified, and so forth.

Figure 5:
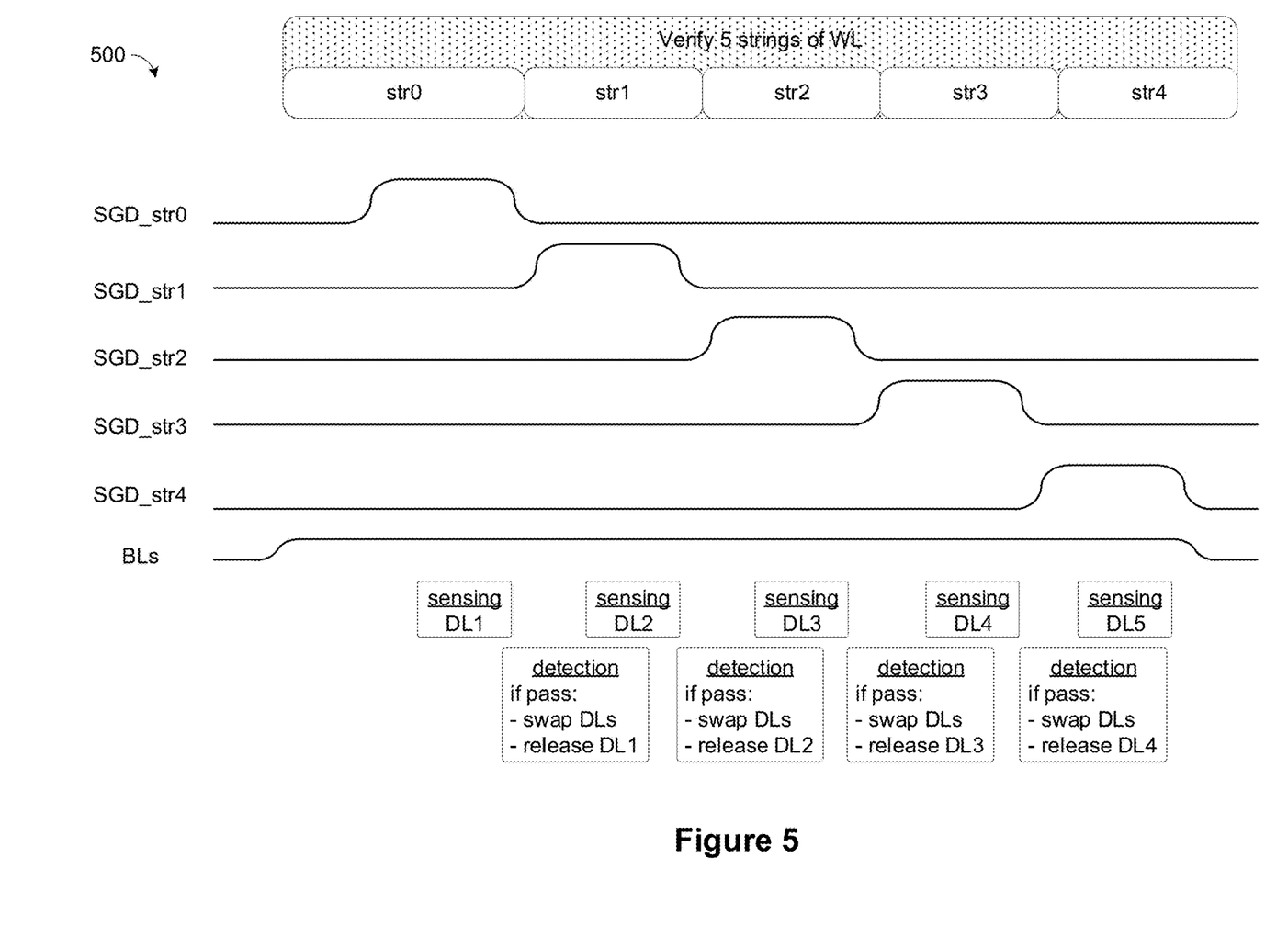
FIG. 5 is a timing diagram for consecutive verification operations with overlapping usage of data latches in accordance with some implementations.

FIG. 5 is a timing diagram 500 for consecutive verification operations (e.g., verify operations 231, FIG. 2) with overlapping usage of data latches in accordance with some implementations. As described above, verification operations may include two phases—a sensing phase and a detection phase. During the sensing phase, the selected word line is asserted to a sensing voltage (e.g., higher than 0V and lower than a read voltage), and the value of the cells of each string of the selected word line is determined (e.g., logic 0 or logic 1). The sensing results are stored in data latches (e.g., DL1-DL5). During the detection phase, the results (0s and 1s) are counted to decide whether the verification operation results in a pass or fail. In some implementations, the sensing and detection phases may overlap (as shown in timing diagram 500). Such overlapping further optimizes the performance of write (program/verify) operations employing this scheme.

More specifically, the detection phase for a particular string (e.g., str0) may overlap with the sensing phase of a subsequent string (e.g., str1). Stated another way, after sensing str0, str0 detection can overlap with str1 sensing. After sensing for a first string (str0), SGD can begin ramping up for the next string (str1) in order to perform sensing for the next string (str1). While the next string (str1) is being sensed, detection for the first string (str0) may conclude with a pass/fail result. If the verification process for the first string (str0) passes, the data latch (DL1) for the first string may be released (made available) for receiving data to be programmed to the first string (str0) of the next word line. If the verification process for the first string (str0) fails, the data latch (DL1) for the first string may retain the data so that the storage controller 124 may recover the data and reprogram the first string (str0) during a subsequent cycle.

The foregoing description has been described with reference to specific implementations. However, the illustrative discussions above are not intended to be exhaustive or to limit the claims to the precise forms disclosed. Many variations are possible in view of the above teachings. The implementations were chosen and described to best explain principles of operation and practical applications, to thereby enable others skilled in the art.

The various drawings illustrate a number of elements in a particular order. However, elements that are not order dependent may be reordered and other elements may be combined or separated. While some reordering or other groupings are specifically mentioned, others will be obvious to those of ordinary skill in the art, so the ordering and groupings presented herein are not an exhaustive list of alternatives.

As used herein: the singular forms "a", "an," and "the" include the plural forms as well, unless the context clearly indicates otherwise; the term "and/or" encompasses all possible combinations of one or more of the associated listed items; the terms "first," "second," etc. are only used to distinguish one element from another and do not limit the elements themselves; the term "if" may be construed to mean "when," "upon," "in response to," or "in accordance with," depending on the context; and the terms "include," "including," "comprise," and "comprising" specify particular features or operations but do not preclude additional features or operations.

What is claimed is:

1. A data storage system, comprising:
  a storage medium including a plurality of strings of single-level cell (SLC) memory cells connected to a plurality of word lines; and
  a storage controller in communication with the storage medium, the storage controller including write circuitry configured to write data to the storage medium by:
    selecting a first word line of the plurality of word lines, the first word line being connected to a first plurality of strings;
    consecutively programming a first group of memory cells of the first plurality of strings connected to the first word line, wherein the first group of memory cells includes a first memory cell from a first string of the plurality of strings and a second memory cell from a second string of the plurality of strings; and
    subsequent to programming the first group of memory cells, consecutively verifying respective programming results of the first group of memory cells including the first memory cell from the first string of the plurality of strings and the second memory cell from the second string of the plurality of strings, wherein consecutively verifying the respective programming results comprises;
      sensing the first memory cell of the first group of memory cells;
      detecting, using a first data latch, a pass or fail status of the first memory cell based on the sensing; and
      sensing the second memory cell of the first group of memory cells during the detecting of the pass or fail status of the first memory cell.

2. The data storage system of claim 1, wherein verifying respective programming results comprises:
  asserting the first word line to a verification voltage;
  while maintaining the first word line at the verification voltage, consecutively asserting and de-asserting respective select gates of respective memory cells of the first group of memory cells; and
  consecutively sensing the respective memory cells while the respective select gates are asserted.

3. The data storage system of claim 2, wherein verifying respective programming results further comprises:
  asserting respective bit lines of the respective memory cells of the first group of memory cells; and
  maintaining assertion of each of the respective bit lines while performing the consecutive sensing of the respective memory cells.

4. The data storage system of claim 2, wherein verifying respective programming results further comprises performing no-lockout sensing on the respective memory cells of the first group of memory cells.

5. The data storage system of claim 1, wherein the write circuitry is further configured to write data to the storage medium by:

subsequent to verifying the respective programming results:
  detecting a failed programming result in a particular memory cell of the first group of memory cells based on the verifying of the respective programming results; and
  subsequent to detecting the failed programming result in the particular memory cell, re-programming and re-verifying the particular memory cell.

6. The data storage system of claim 1, wherein verifying the respective programming results further comprises:
  in accordance with a detected pass status of the first memory cell, releasing the first data latch; and
  receiving data at the first data latch to be programmed to a memory cell of a second group of memory cells of the first plurality of strings connected to a second word line while continuing to verify respective programming results of the first group of memory cells of the first plurality of strings connected to the first word line.

7. A method of writing data to a storage medium of a data storage system, comprising:
  at a storage controller in communication with the storage medium:
    selecting a first word line of a plurality of word lines of the storage medium, the first word line being connected to a first plurality of strings;
    consecutively programming a first group of memory cells of the first plurality of strings connected to the first word line, wherein the first group of memory cells includes a first memory cell from a first string of the plurality of strings and a second memory cell from a second string of the plurality of strings; and
    subsequent to programming the first group of memory cells, consecutively verifying respective programming results of the first group of memory cells including the first memory cell from the first string of the plurality of strings and the second memory cell from the second string of the plurality of strings, wherein consecutively verifying the respective programming results comprises;
    sensing the first memory cell of the first group of memory cells;
    detecting, using a first data latch, a pass or fail status of the first memory cell based on the sensing; and
    sensing the second memory cell of the first group of memory cells during the detecting of the pass or fail status of the first memory cell.

8. The method of claim 7, wherein verifying respective programming results comprises:
  asserting the first word line to a verification voltage;
  while maintaining the first word line at the verification voltage, consecutively asserting and de-asserting respective select gates of respective memory cells of the first group of memory cells; and
  consecutively sensing the respective memory cells while the respective select gates are asserted.

9. The method of claim 8, wherein verifying respective programming results further comprises:
  asserting respective bit lines of the respective memory cells of the first group of memory cells; and
  maintaining assertion of each of the respective bit lines while performing the consecutive sensing of the respective memory cells.

10. The method of claim 8, wherein verifying respective programming results further comprises performing no-lockout sensing on the respective memory cells of the first group of memory cells.

11. The method of claim 7, further comprising, at the storage controller:
  subsequent to verifying the respective programming results:
    detecting a failed programming result in a particular memory cell of the first group of memory cells based on the verifying of the respective programming results; and
    subsequent to detecting the failed programming result in the particular memory cell, re-programming and re-verifying the particular memory cell.

12. The method of claim 7, wherein verifying the respective programming results further comprises:
  in accordance with a detected pass status of the first memory cell, releasing the first data latch; and
  receiving data at the first data latch to be programmed to a memory cell of a second group of memory cells of the first plurality of strings connected to a second word line while continuing to verify respective programming results of the first group of memory cells of the first plurality of strings connected to the first word line.

13. A data storage system, comprising:
  a storage medium including a plurality of strings of single-level cell (SLC) memory cells connected to a plurality of word lines; and
  a storage controller in communication with the storage medium, the storage controller including:
    means for selecting a first word line of the plurality of word lines, the first word line being connected to a first plurality of strings;
    means for consecutively programming a first group of memory cells of the first plurality of strings connected to the first word line, wherein the first group of memory cells includes a first memory cell from a first string of the plurality of strings and a second memory cell from a second string of the plurality of strings; and
    means for, subsequent to programming the first group of memory cells, consecutively verifying respective programming results of the first group of memory cells including the first memory cell from the first string of the plurality of strings and the second memory cell from the second string of the plurality of strings, wherein the means for consecutively verifying the respective programming results comprise:
      means for sensing the first memory cell of the first group of memory cells;
      means for detecting, using a first data latch, a pass or fail status of the first memory cell based on the sensing; and
      means for sensing the second memory cell of the first group of memory cells during the detecting of the pass or fail status of the first memory cell.

14. The data storage system of claim 13, wherein the means for consecutively verifying the respective programming results comprise:
  means for asserting the first word line to a verification voltage;
  means for consecutively asserting and de-asserting respective select gates of respective memory cells of the first group of memory cells while maintaining the first word line at the verification voltage; and
  means for consecutively sensing the respective memory cells while the respective select gates are asserted.

15. The data storage system of claim 14, wherein the means for verifying the respective programming results further comprise:

means for asserting respective bit lines of the respective memory cells of the first group of memory cells; and means for maintaining assertion of each of the respective bit lines while performing the consecutive sensing of the respective memory cells.

16. The data storage system of claim 14, wherein the means for verifying the respective programming results further comprise means for performing no-lockout sensing on the respective memory cells of the first group of memory cells.

17. The data storage system of claim 13, wherein the storage controller further comprises:

means for detecting a failed programming result in a particular memory cell of the first group of memory cells based on the verifying of the respective programming results; and means for re-programming and re-verifying the particular memory cell subsequent to detecting the failed programming result in the particular memory cell.

18. The data storage system of claim 17, wherein the means for verifying the respective programming results further comprise:

means for releasing the first data latch in accordance with a detected pass status; and means for receiving data at the first data latch to be programmed to a memory cell of a second group of memory cells of the first plurality of strings connected to a second word line while continuing to verify respective programming results of the first group of memory cells of the first plurality of strings connected to the first word line.

* * * * *